(12) United States Patent
Araki (10) Patent No.: US 6,809,532 B2
(45) Date of Patent: Oct. 26, 2004

(54) INSPECTION METHOD AND INSPECTION APPARATUS FOR SEMICONDUCTOR CIRCUIT

(75) Inventor: Chihiro Araki, Shuuchi-gun (JP)

(73) Assignee: Kabushiki Kaisha Moric, Mori-machi (JP)

( * ) Notice: Subject to any disclaimer, the term of this patent is extended or adjusted under 35 U.S.C. 154(b) by 0 days.

(21) Appl. No.: 10/063,869

(22) Filed: May 21, 2002

(65) Prior Publication Data

US 2002/0180467 A1 Dec. 5, 2002

(30) Foreign Application Priority Data

May 30, 2001 (JP) ........................................ 2001-161739

(51) Int. Cl.[7] .......................................... G01R 31/302
(52) U.S. Cl. ...................................... 324/750; 324/751
(58) Field of Search ............................... 324/158.1, 750, 324/751, 753, 755, 760, 670, 721; 325/752, 785; 374/41; 356/394; 702/130, 58; 371/151

(56) References Cited

U.S. PATENT DOCUMENTS 5,440,566 A * 8/1995 Spence ........................ 374/41

* cited by examiner

Primary Examiner—Kamand Cuneo
Assistant Examiner—Trung Q. Nguyen
(74) Attorney, Agent, or Firm—Ernest A. Beutler (57) ABSTRACT

A method and apparatus employing image processing of photographic data by a thermographic camera to determine the heat development of individual semiconductor devices. Therefore, defects of individual devices such as disconnection due to breaks and abnormal heat development due to electrostatic breakdowns can be determined reliably.

4 Claims, 7 Drawing Sheets

INSPECTION METHOD AND INSPECTION APPARATUS FOR SEMICONDUCTOR CIRCUIT

BACKGROUND OF THE INVENTION

This invention relates to an inspection method and an inspection apparatus for semiconductor circuits with a plurality of semiconductor devices.

In production processes of various semiconductor devices consisting of circuit boards with a plurality of semiconductors mounted thereon, after assembly on a circuit board, the functioning of the semiconductor circuit board (workpiece) is inspected before it is transferred for shipment or movement to the next process. In performing the functional inspection, conventionally, the quality (defective or non-defective) of the workpiece has been determined by applying a working current for the semiconductor devices to the workpiece and a test is performed of whether each semiconductor device works or not.

The previous testing methods and apparatus do not in all instances offer a complete test of each semiconductor in the complete circuit. For example, in a semiconductor circuit with a plurality of semiconductors connected in parallel, if one device is disconnected due to a open breakage, the current flows into the other devices, so that no defect of the workpiece will be detected.

Recognizing this defect in the testing procedure, it has been proposed to apply a large current, over the normal limit value, to flow to detect the existence of a device subject to open breakage. However, if such a large current is inputted to the workpiece for inspection, when a defective device exists, the other normal devices may all be broken. This wastes the workpiece and decreases the yield rate, thus increasing the piece price. Therefore, a one hundred percent inspection is dispensed with and a sampling inspection is performed for each lot. Obviously this results in insufficient reliability of the inspection.

In this case, even if deterioration of the working characteristic of the whole workpiece can be determined, it is impossible to determine which device is defective. On the other hand, if all the devices are inspected individually, a measuring apparatus with multiple minute inspection probes would be required. In such an event, the measuring apparatus would be a complicated one and expensive. Also, if the same loading voltage and current as in the condition of actual use are applied to each workpiece, the power supplying device and the loading device would be expensive.

In addition, if a device develops only a small electrostatic breakdown, it will still allow current to flow and would pass a conventional inspection method. In the case of such an electrostatic breakdown, the device will initially work, but deterioration of the broken-down device progresses during its use, causing malfunction of the whole circuit and decreasing the circuit life.

Therefore it is an object of this invention to provide an inspection method and an inspection apparatus for a semiconductor circuit that is capable of determining reliably the quality (defective or non-defective) of each device in the circuit even if a plurality of semiconductor devices are connected in parallel.

SUMMARY OF INVENTION

This invention is adapted to be embodied in an inspection method for a semiconductor circuit with a plurality of connected semiconductor devices. The method comprises the steps of applying an electrical load on the circuit, taking a photograph of the circuit with a thermographic camera to detect heat development of each semiconductor device in response to the applied load, and determining the quality of circuit and semiconductor devices based on the heat development.

In a preferred embodiment the temperature of the devices are measured at different points of time, and the quality (defective or non-defective) of the device is determined based on the temperature difference.

A further feature of the invention is adapted to be embodied in an inspection apparatus for a workpiece consisting of a semiconductor circuit with a plurality of connected semiconductor. The inspection apparatus comprises an apparatus body on which a workpiece to be inspected is set. A loading circuit for applying load corresponding to the condition of use to the workpiece is also provided along with a power source for supplying a working current to the workpiece through the loading circuit. A drive waveform generating circuit applies a drive signal to the workpiece. A thermographic camera takes photographs of the workpiece set on the apparatus body and an image processor receives signals from thermographic camera. Finally a control for controls the inspection apparatus to perform an inspection program.

DETAILED DESCRIPTION

Figure 1:
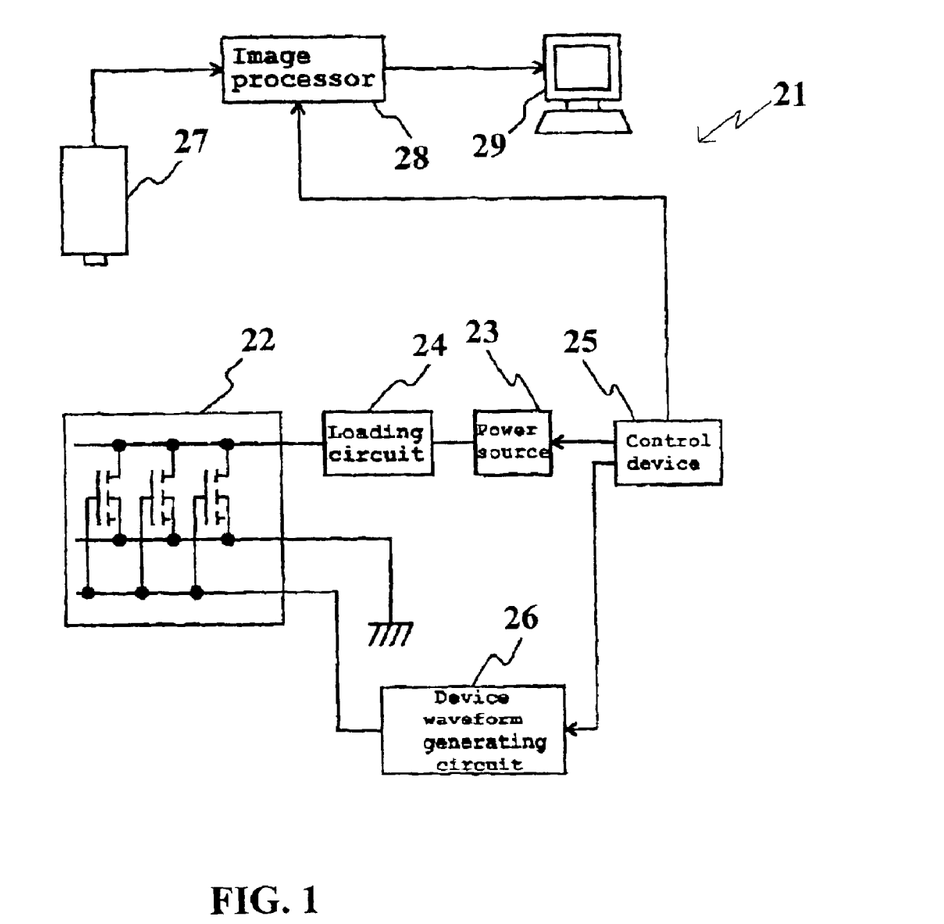
FIG. 1 is a schematic diagram of a semiconductor circuit inspection apparatus according to this invention and capable of performing an inspection operation in accordance with the invention.

Referring now in detail to the drawings and initially to FIG. 1, this shows a block diagram of a semiconductor circuit inspection apparatus constructed and operated according to an embodiment of this invention, indicated generally as 21. A workpiece namely a print circuit board, a specific example of which will be described later by reference to FIGS. 5–13, is indicated generally by the reference numeral 22. This workpiece 21 is set on an inspection apparatus body of a suitable type (not shown).

A power source 23 is connected to the workpiece 22 through a loading circuit 24. The loading circuit 24 is a circuit in which load the same as or smaller than that in the condition of actual use, is applied to the workpiece 22 to test the performance or the characteristic of the workpiece 22.

The power source 23 is connected to a control device 25. The control device 25 controls ON/OFF of the work controlling power source 23. The control device 25 is connected to the workpiece 22 through a drive waveform generating circuit 26. The drive waveform generating circuit 26 produces drive signal waveforms for switching semiconductors to be inspected, and applies the signal to the FETs of the workpiece 22.

A thermographic camera 27 is provided above the workpiece 22 that is set on the apparatus body for taking photographs of the workpiece 22. The thermographic camera 27 takes photographs of the workpiece 22 and sends the heat image data to an image processor 28. The image processor 28 processes the heat image data and executes temperature calculation or the like according to a program in the control device 25 or an input command signal. The result is of this calculation is displayed on a monitor 29.

Figure 2:
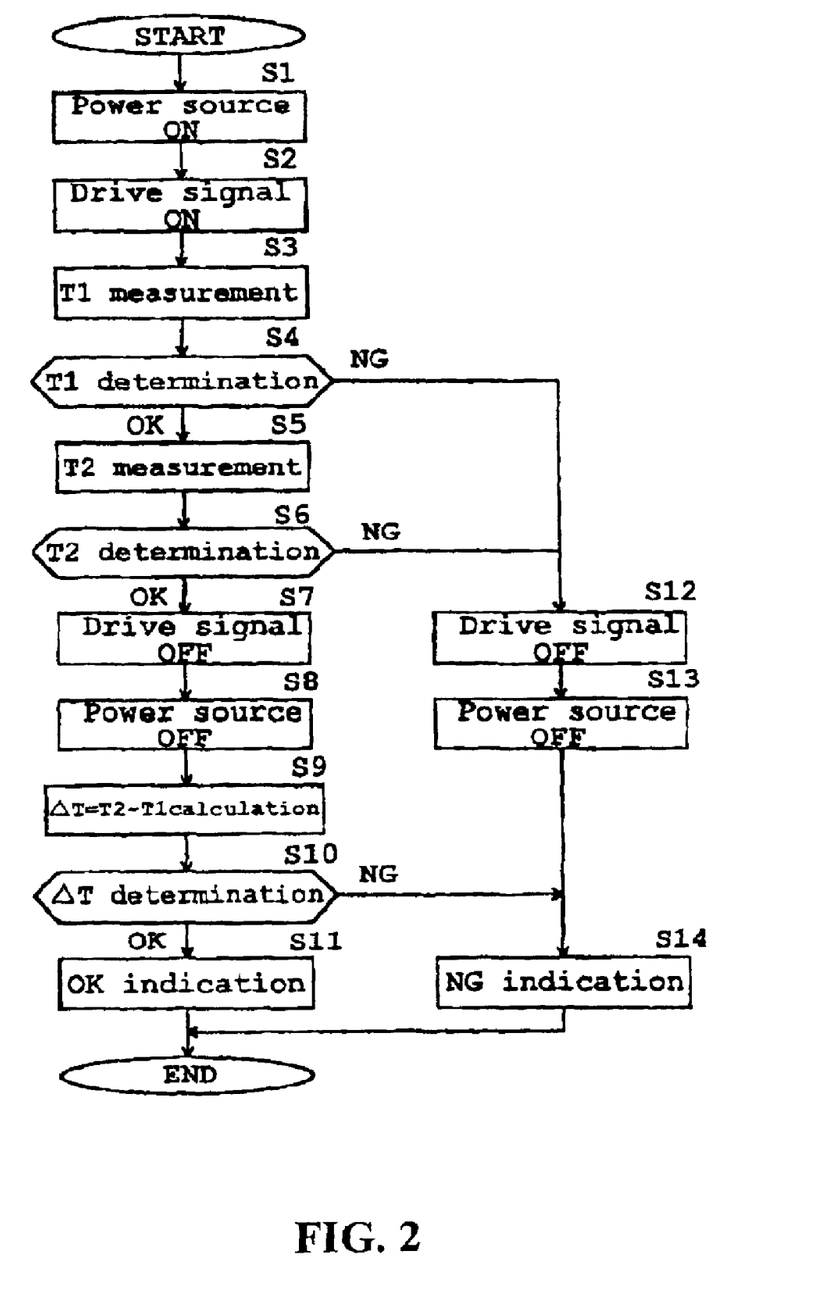
FIG. 2 is a flowchart of an inspection method using the inspection apparatus of FIG. 1 and performing a method embodying the invention.
Figure 3:
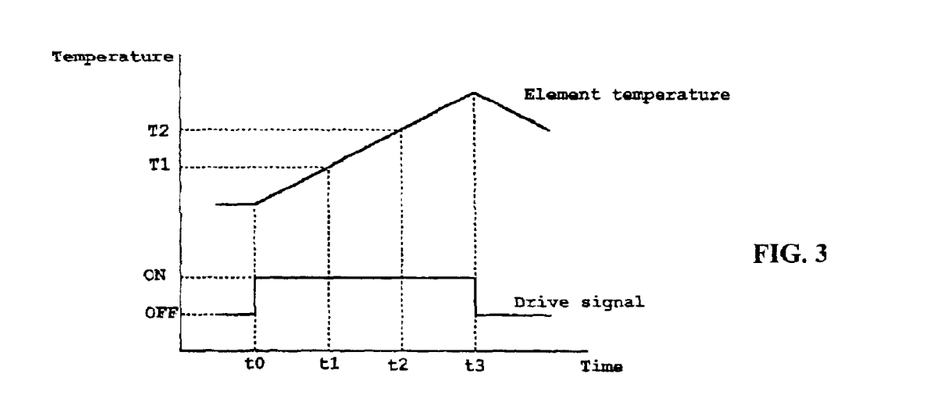
FIG. 3 is a time chart resulting from practicing the invention in accordance with the flowchart of FIG. 2.

The preferred operational method of the invention will now be described by reference to FIG. 2 which is a flowchart of a semiconductor circuit inspection method using the inspection apparatus of FIG. 1. Reference will also be made to FIG. 3 which a time and temperature chart. The program begins at the Step S1 in which the work controlling power source 23 (FIG. 1) is switched ON by hand or by an input command by a GPIB communication line or the like from the control device 25. At this moment or a little before this moment, photographs of individual devices (diodes 33 or FETs 34 FIGS. 5–7) of the workpiece 22 are taken with the thermographic camera 27 and the heat image data is sent to the image processor 28.

Then at the Step S2 a drive signal for switching semiconductor devices (FETs) from the drive waveform generating circuit 26 are ON. Operation of the step S2 may be performed at the same time as the step S1. As a result of the steps S1, S2, FETs 34 of the workpiece 22 are operated, raising their temperature. The steps S1 and S2 are performed at the time to in the time diagram FIG. 3.

Following at the time t1 at the Step S3 the temperature T1 of each FET 34 of the workpiece 22 is measured by the image processor 28. Then at the Step S4 it is determined whether or not temperature T1 is within the predetermined allowable range (within the temperature range in the normal operation). If it is, then at the Step S5 the temperature T2 is measured at time t2 from the heat image data.

At the Step S6 it is determined whether or not temperature T2 is within the predetermined allowable range (within the temperature range in the normal operation). If at the Step S7 the temperature T2 is normal, the drive signal applied to the workpiece 22 at time t3 by the drive waveform generating circuit 26 is turned OFF. Then at the Step S8 following the step S7 or at the same time as in FIG. 3, the power source 23 is switched OFF. Thus, current supply for inspection is finished and the temperature of the device begins failing as shown in FIG. 3.

At the Step S9 the temperature difference OLE_LINK1 ($\Delta T = T1 - T2$) from the temperature data T1, T2 measured at the steps S3, S5, is calculated. Thus, temperature rise from t1 to t2 for each FET 34 is calculated. Then at the Step S10 it is determined whether or not the value $\Delta T$ of the temperature rise calculated at the step S9 is within the range of temperature rise of a normal device.

As a result of the quality (defective or non-defective) of the individual devices 34 being determined from the temperature difference as described above, compared with when determination is made only from T1 or T2, the quality (defective of non-defective) of the individual devices can be determined based on the heat development characteristic of the device itself without influence of dispersion of the characteristics specific to individual devices or dispersion of the characteristics between all devices or lots in a production line and without influence of the temperature of the apparatus or the device, or the ambient temperature at the beginning of the measurement, enhancing reliability of the inspection.

Also, even if both T1 and T2 are normal at the steps S4 and S6, respectively, the difference $\Delta T$ can be out of the normal range depending on the criterion range of T1 and T2 at the steps S4, S6, therefore a step S10 should preferably be provided in addition to the steps S4, S6 for determination of T1, T2.

Then if the value $\Delta T$ is normal at the Step S11 an OK-sign is indicated on a monitor screen or other indicating lamp that inspection result of the workpiece is normal.

As implied above, if temperature T1 or T2 at the step S4 or S5 is out of the normal range, the program moves to the Step S12 where the drive waveform generating circuit 26 is switched OFF. Following the step S12 or at the same time, at the Step S13 the power source 23 is switched OFF. The aim of this step is to finish inspection because of the abnormality of the device found.

When it is determined that the workpiece is abnormal at the steps S4, S6 and S10, NG-sign is indicated on a monitor screen or other indicating lamp that the device is defective at the Step S14.

Figure 4:
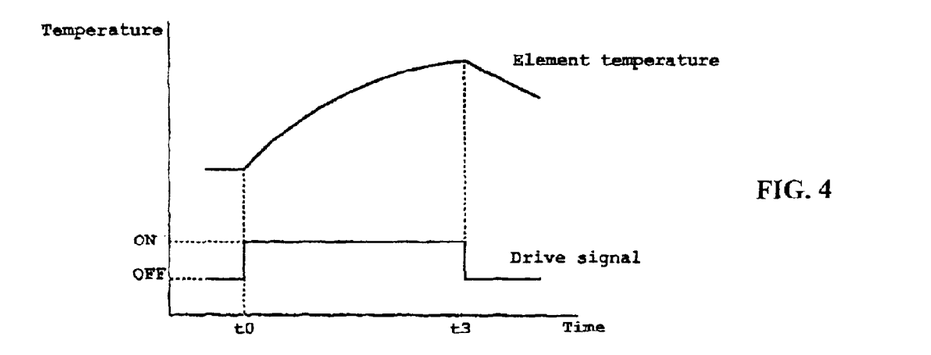
FIG. 4 is a diagram in part similar to FIG. 3 but showing the results obtained in accordance with another embodiment of the invention.

FIG. 4 is a diagram of another embodiment of this invention that employs a different method for determining that a device is defective. This method is based the fact that a device is known to experience a temperature change when a current is inputted to the device. Also it is known that the temperature change is different when the resistance value is increased due to a defective solder joint of the device or voids generated in the solder joint.

Therefore in accordance with this method, the temperature change of each device is determined from temperature measurements taken at least at three points of time after an inspection current is inputted into the workpiece. The temperature change of each device is compared with a known temperature profile at the time of an electrostatic breakdown or void generation, to detect a defective device as well as the cause of the defect.

For example, and as shown in FIG. 4, relative to a normal device, a device whose solder joint has voids, has a more significant tendency of temperature rise in a temperature profile of upwardly convex shape when a drive signal is applied. Therefore, if temperatures are measured at different points of time more than twice, a general temperature profile can be obtained, and a device having a defective joint due to voids can be determined.

Regarding a device having an abnormal VGS-IV characteristic due to an electrostatic breakdown, since the general temperature profile is known, if temperatures of the devices are measured at different points of time more than twice to detect the temperature profile, a device having an electrostatic breakdown can be determined.

Referring now to FIGS. 5–13 these show a specific type of workpiece that can be tested with the apparatus and methods already described and show an embodiment where a substrate with mounted devices can be used as a motor control unit for driving an electric-powered vehicle.

Figure 5:
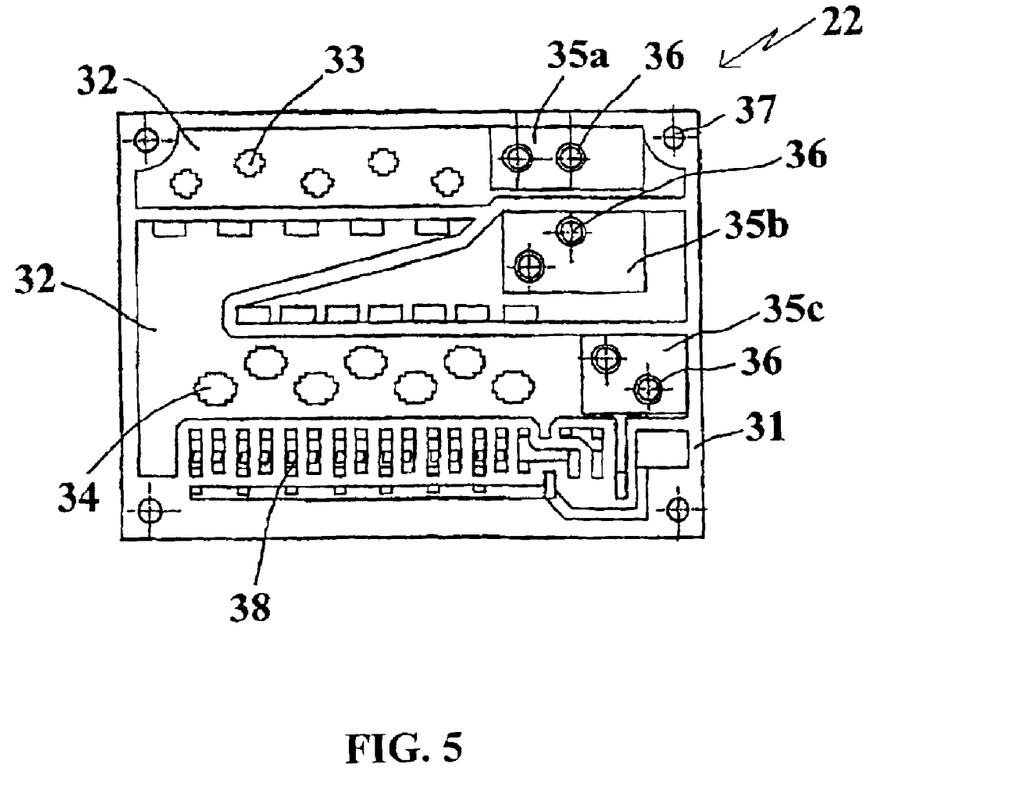
FIG. 5 is a top plan view of an aluminum substrate to which a circuit tested by the present invention is applied.
Figure 6:
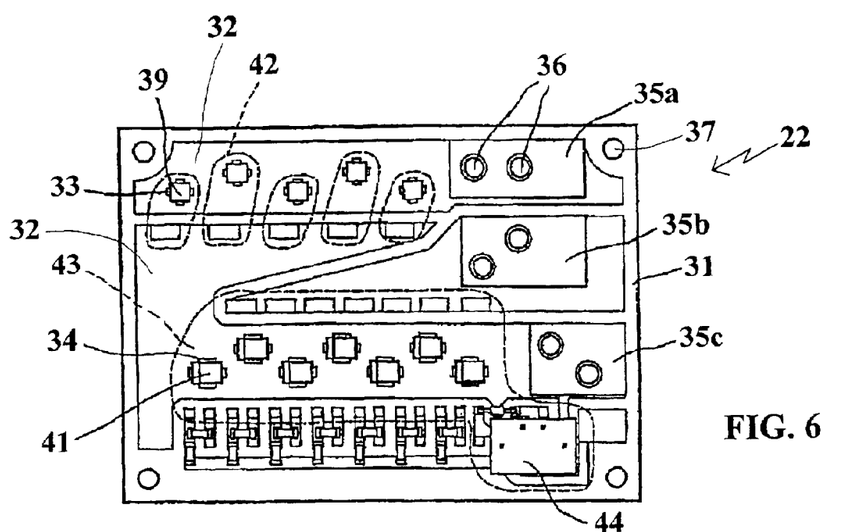
FIG. 6 is a top plan view, in part similar to FIG. 5, but showing the chips and other components mounted on the aluminum substrate.
Figure 7:
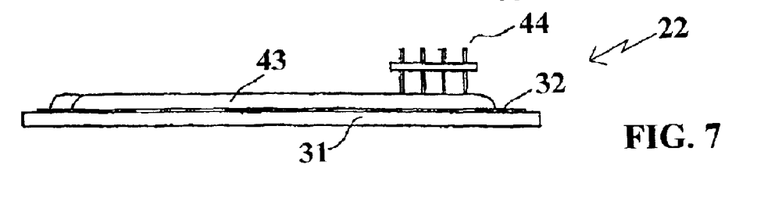
FIG. 7 is a side elevational view of the structure shown in FIG. 6.

As shown first in FIGS. 5–7, the device 22 is comprised of a conductor pattern of copper (not shown) is formed on an aluminum substrate 31 and coated with a resist 32. By patterning the resist 32, diode land patterns 33 and FET land patterns 34 constituting portions of a motor control circuit are formed. Output terminals 35a, 35b, and 35c of the control circuit are formed at three places on the aluminum substrate 31 each having two output terminal holes 36, respectively. At the four corners of the aluminum substrate 31 are disposed mounting holes 37 for fixing a casing body as will be described later by reference to FIGS. 8–13. Further on the substrate is provided a gate resistance 38 forming a further component of the drive circuit.

Diodes 39 are soldered within the respective diode land patterns 33, and FETs 41 are soldered within the respective FET land patterns 34. Each diode 39 is respectively sealed or potted with a resin 42. Each FET 41 is sealed with resin 43 along with a connector 44. A commercially available liquid sealing material or resin of linear expansion coefficient of $(15 \text{ to } 30) \times 10^{-6}/°$ C. can be selected to use as the potting material for sealing such diodes 39 and FETs 41. For example, sealing materials of linear expansion coefficient of $15 \times 10^{-6}/°$ C. and $22 \times 10^{-6}/°$ C. approximate to those of copper and aluminum respectively are easily available in the market.

Referring now to FIGS. 8–13, these figures show how a complete motor control unit incorporating the aluminum substrate 31 of FIGS. 5–7 can be constructed. The motor control unit, indicated generally by the reference numeral, 45 includes a drive control circuit configured of the aluminum substrate 31 as previously described by reference to FIGS. 4–6 in a casing body 46.

Figure 8:
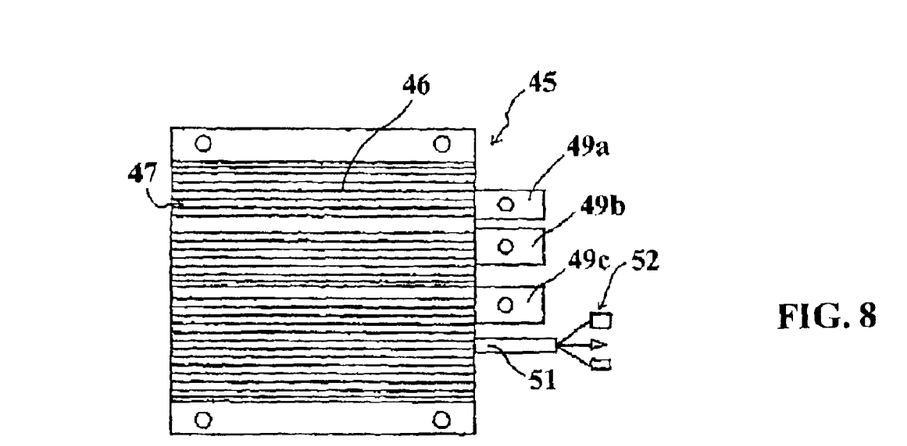
FIG. 8 is top plan view of a motor control unit for an electric-powered vehicle incorporating a circuit tested in accordance with the invention.
Figure 9:
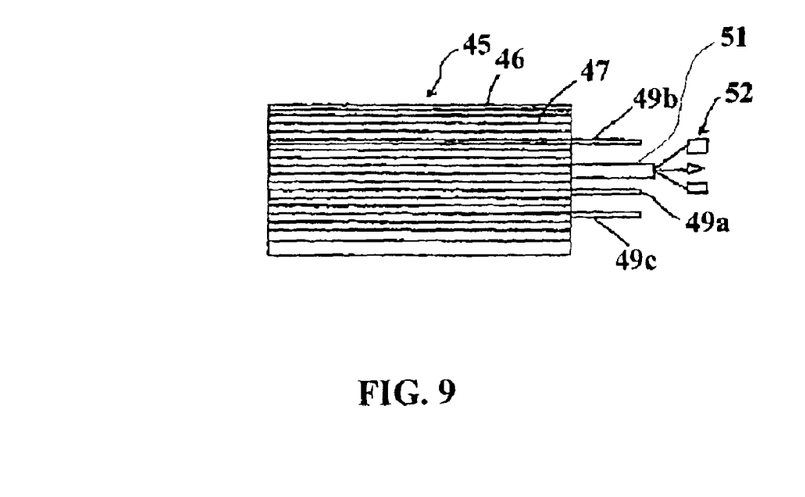
FIG. 9 is a side elevational view of the motor control unit.
Figure 10:
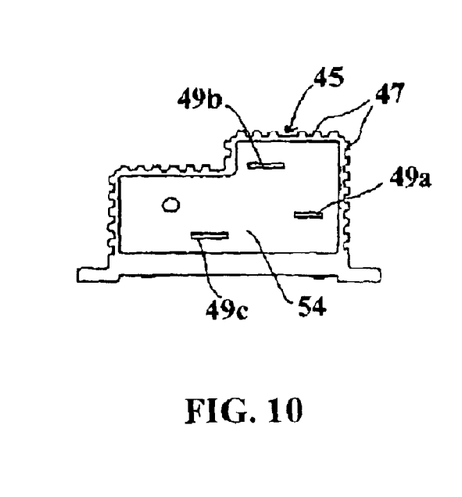
FIG. 10 is an end elevational view of the motor control unit.

The casing body 46 is formed by the extrusion of a metallic material of aluminum or aluminum alloy. The casing body 46 is of a cylindrical shape with both ends open. A plurality of aligned parallel ribs 47 are formed to project from its outer circumferential surface. The ribs 47 increase the surface area of the casing body 46, resulting in the increase of heat radiation as well as the rigidity and strength of the casing body 46.

Figure 11:
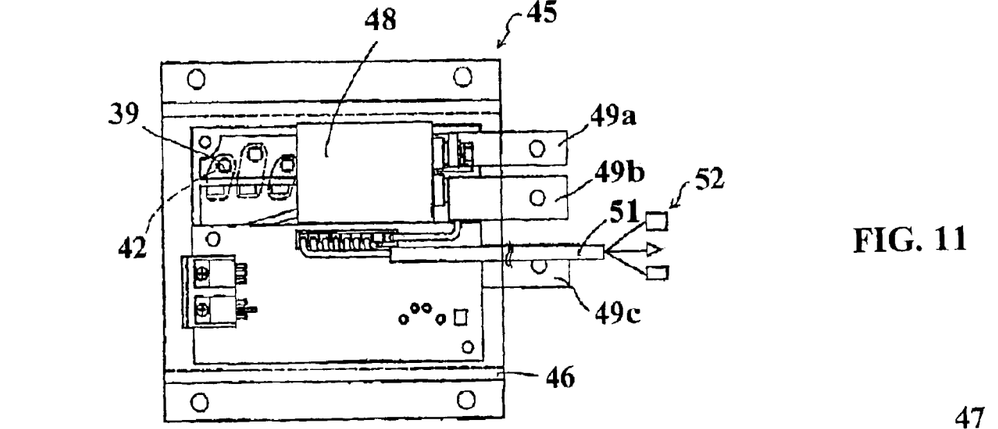
FIG. 11 is a top plan view in part similar to FIG. 8, but with the potting compound removed and showing the contained components in solid lines.
Figure 12:
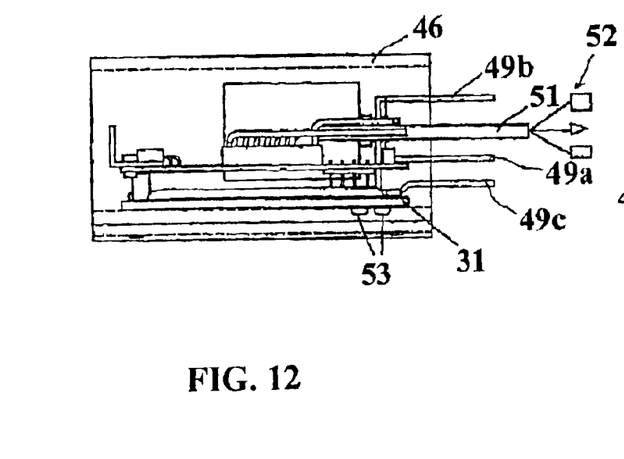
FIG. 12 is a side elevational view in part similar to FIG. 9, but with the potting compound removed and showing the contained components in solid lines.
Figure 13:
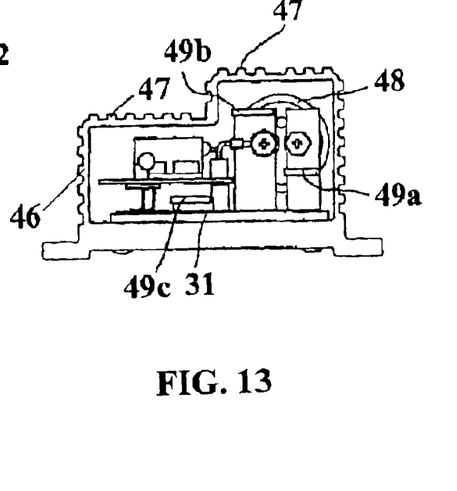
FIG. 13 is an end elevational view in part similar to FIG. 10, but with the potting compound removed and showing the contained components in solid lines.

On the aluminum substrate 31 are mounted further devices constituting a drive control circuit such as an electrolytic capacitor 48 constituting a drive control circuit (FIG. 11). Also terminal attaching plates 49a, 49b, and 49c are connecting to the aforementioned output terminals 35a, 35b, and 36c Each signal wire of the control circuit is connected through an electric cable 51 and a coupler 52 to switches and other drive or control parts on the vehicle side. Output terminals 53 passing through the aforementioned output terminal holes 37 project from the lower surface of the aluminum substrate 31. Such an aluminum substrate 31 and the electronic parts mounted thereon are accommodated in the casing body 46 and sealed or potted with resin 54.

As described above, in this invention, image processing of the photographic data by a thermographic camera allows the heat development of individual semiconductor devices to be detected. Therefore, defects of individual devices such as disconnection due to breaks and abnormal heat development due to electrostatic breakdowns can be determined reliably. Of course those skilled in the art will readily perceive that the foregoing description is of preferred embodiments of the test methods and apparatus and that various changes and modifications may be made without departing from the spirit and scope of the invention as defined by the appended claims.

What is claimed is:

1. An inspection method for a semiconductor circuit with a plurality of connected semiconductor devices comprising the steps of applying an electrical load on the circuit, taking a photograph of the circuit with a thermographic camera to detect heat development of each semiconductor device in response to the applied load, and processing the photograph to determine the temperature of the semiconductor devices for and determining the quality of circuit and semiconductor devices based on the heat development solely from the temperature measurement.

2. The inspection method for a semiconductor circuit according to claim 1, wherein at least some of the semiconductor devices are connected in parallel.

3. The inspection method for a semiconductor circuit according to claim 1, wherein temperatures of the semiconductor devices are measured at different points of time, and the quality of the circuit and semiconductor devices is determined based on the temperature difference.

4. An inspection apparatus for a workpiece consisting of a semiconductor circuit with a plurality of connected semiconductor comprising an apparatus body on which a workpiece to be inspected is set, a loading circuit for applying load corresponding to the condition of use to the workpiece, a power source for supplying a working current to the workpiece through said loading circuit, a drive waveform generating circuit for applying a drive signal to said workpiece, a thermographic camera for taking photographs of the workpiece set on said apparatus body, an image processor connected to said thermographic camera for determining the temperatures of said semiconductor devices solely from the output of said thermographic camera and determining the quality of circuit and semiconductor devices based solely on the temperature measurement, and a control for controlling said inspection apparatus to perform an inspection program.

* * * * *

UNITED STATES PATENT AND TRADEMARK OFFICE
CERTIFICATE OF CORRECTION

PATENT NO. : 6,809,532 B2
APPLICATION NO. : 10/063869
DATED : October 26, 2004
INVENTOR(S) : Chihiro Araki It is certified that error appears in the above-identified patent and that said Letters Patent is hereby corrected as shown below:

Col. 6, line 21, Claim 1 should read as follows: 1.An inspection method for a semiconductor circuit with a plurality of connected semiconductor devices comprising the steps of applying an electrical load on the circuit, taking a photograph of the circuit with a thermographic camera to detect heat development of each semiconductor device in response to the applied load, and processing the photograph to determine the temperature of the semiconductor devices for determining the quality of circuit and semiconductor devices based on the heat development.

Col. 6, line 39, Claim 4 should read as follows: 4.An inspection apparatus for a workpiece consisting of a semiconductor circuit with a plurality of connected semiconductor comprising an apparatus body on which a workpiece to be inspected is set, a loading circuit for applying load corresponding to the condition of use to the workpiece, a power source for supplying a working current to the workpiece through said loading circuit, a drive waveform generating circuit for applying a drive signal to said workpiece, a thermographic camera for taking photographs of the workpiece set on said apparatus body, an image processor connected to said thermographic camera for determining the temperatures of said semiconductor devices solely from the output of said thermographic camera, and a control for controlling said inspection apparatus to perform an inspection program.

Signed and Sealed this

Seventh Day of August, 2007

JON W. DUDAS
*Director of the United States Patent and Trademark Office*